United States Patent
Kodavalla

(10) Patent No.: US 9,348,961 B2
(45) Date of Patent: May 24, 2016

(54) LOGIC ANALYZER CIRCUIT FOR PROGRAMMABLE LOGIC DEVICE

(71) Applicant: Vijay Kumar Kodavalla, Bangalore (IN)

(72) Inventor: Vijay Kumar Kodavalla, Bangalore (IN)

(73) Assignee: WIPRO LIMITED, Bangalore (IN)

( * ) Notice: Subject to any disclaimer, the term of this patent is extended or adjusted under 35 U.S.C. 154(b) by 115 days.

(21) Appl. No.: 14/283,454

(22) Filed: May 21, 2014

(65) Prior Publication Data

US 2015/0278418 A1 Oct. 1, 2015

(30) Foreign Application Priority Data

Mar. 27, 2014 (IN) ............................ 1643/CHE/2014

(51) Int. Cl.
*G06F 17/50* (2006.01)

(52) U.S. Cl.
CPC ........ *G06F 17/5054* (2013.01); *G06F 2217/14* (2013.01)

(58) Field of Classification Search
USPC .......................................................... 716/116
See application file for complete search history.

(56) References Cited

U.S. PATENT DOCUMENTS

| 6,182,247 | B1 | 1/2001 | Herrmann et al. |
| 6,822,474 | B2 | 11/2004 | Chaudhari |
| 6,834,360 | B2 | 12/2004 | Corti et al. |
| 7,882,465 | B2 | 2/2011 | Li et al. |
| 2002/0194543 | A1* | 12/2002 | Veenstra ............ G01R 31/3177 714/39 |
| 2003/0097615 | A1* | 5/2003 | Corti ................... G06F 11/3636 714/37 |
| 2004/0098638 | A1* | 5/2004 | Rally ............... G01R 31/31705 714/27 |

OTHER PUBLICATIONS

Brian Caslis, "Effectively Using Internal Logic Analyzers for Debugging FPGAs", Electronic Engineering Journal, FPGA Journal (2008), 3 pages.

* cited by examiner

*Primary Examiner* — Mohammed Alam
(74) *Attorney, Agent, or Firm* — Finnegan, Henderson, Farabow, Garrett & Dunner, LLP

(57) ABSTRACT

The present disclosure relates to methods and related systems and computer-readable mediums. The methods include receiving a design for a programmable logic device (PLD). The design includes a plurality of nodes. The method also includes modifying, via one or more hardware processors, the design to include a logic analyzer circuit. The logic analyzer circuit includes inputs for a plurality of selectable groups of capture signals for connecting to selected nodes of the plurality of nodes. In addition, the method includes outputting the design to the PLD to program the PLD. The disclosure also relates a system comprising a user logic circuit, a logic analyzer circuit, and a memory.

20 Claims, 8 Drawing Sheets

LOGIC ANALYZER CIRCUIT FOR PROGRAMMABLE LOGIC DEVICE

PRIORITY CLAIM

This U.S. patent application claims priority under 35 U.S.C. §119 to: Indian Patent Application No, 1643/CHE/2014, filed Mar. 27, 2014. The aforementioned applications are incorporated herein by reference in their entirety.

TECHNICAL FIELD

The present invention relates to logic analyzer circuits, and more particularly, to logical analyzer circuits for programmable logic devices.

BACKGROUND

A programmable logic device (PLD) allows users to build reconfigurable digital circuits. There are numerous types of programmable logic devices, such as field-programmable gate arrays (FPGAs) and complex programmable logic devices (CPLDs). These devices are programmed using a hardware programming language, such as VHSIC Hardware Description Language (VHDL) or Verilog, to describe the desired circuitry. Code is then synthesized on a computing device, and necessary connections are placed and routed to generate a bit-map. The bit-map is downloaded to the programmable logic device to create the operative circuitry.

Hardware programming languages are very powerful and can be used to create complex designs. However, the resultant circuitry must be tested for errors or "bugs" which could arise during coding, synthesis, bit-map generation, or implementation on a PLD. Tools are thus needed to correctly diagnose a problem with the circuitry on a PLD by identifying the source of the problem, thereby facilitating development of a solution. Diagnosing the problem typically involves sampling various nodes of the PLD to determine their state at a point in time.

Currently, there are two primary techniques to test PLDs: (1) using an external logic analyzer, and (2) using an on-chip logic analyzer circuit. When an external logic analyzer is used, it is connected to a PLD. This requires the user to alter the bit-map for the PLD such that the desired nodes for sample are mapped to available user input/output (I/O) buffers on the PLD. Using an external logic analyzer is not preferable because external logic analyzers are very expensive. Additionally, free user I/O buffers are not always available.

An on-chip logic analyzer circuit samples various internal nodes of a PLD based on specified trigger conditions and stores the captured signals in on-chip block memories. An embedded logic analyzer circuit for a PLD is described in U.S. Pat. No. 6,182,247. As depicted in FIG. 1, logic analyzer circuit 120 samples at nodes between user logic circuitry 111. Trigger signal 103 of User logic trigger node 102 is sampled by trigger signal circuit 121. When Trigger signal circuit 121 determines a trigger condition is et, capture signal circuit 122 stores capture signal 104 of user logic circuit capture node 101.

While the described on-chip logic analyzer circuit tries to solve the problems associated with external logic analyzers, the described on-chip logic analyzer circuit has many limitations. First, it is a static design that cannot be changed easily. Further, during the debugging process, it may be determined that different nodes must be sampled for capture to fully determine the problem with the PLD logical design. The trigger nodes may also need to be altered to gather additional data or correct an error in the sampling process. With each subsequent change the steps of placement and routing, bit-map generation, and downloading the bit-map to the PLD must be repeated. Because these steps are quite time-consuming processes, especially on larger user logic circuit designs, multiple iterations act as a bottleneck in the debugging process.

Further, the number of user logic circuit nodes which can be captured may be restricted because storage is limited on the PLD. The limited amount of storage negatively impacts both the number of capture signals that can be simultaneously sampled and stored, as well as the rate at which the capture signals can be sampled and stored. More capture signals may be simultaneously sampled, however the sampling rate may drop due to limited block memory. Thus, the size of block memories can hinder the debugging process because efficient resolution of complex problems requires high speed sampling of many capture signals.

Embodiments of the disclosure may solve these problems as well as others.

SUMMARY

Certain embodiments of the present disclosure relate to a computer-implemented method. The method includes receiving a design for a programmable logic device (PLD). The design includes a plurality of nodes. The method also includes modifying, via one or more hardware processors, the design to include a logic analyzer circuit. The logic analyzer circuit includes inputs for a plurality of selectable groups of capture signals for connecting to selected nodes of the plurality of nodes. In addition, the method includes outputting the design to the PLD to program the PLD.

Certain embodiments of the present disclosure relate to a non-transitory, computer-readable medium that stores instructions. When the instructions are executed by a processor, the processor performs a method. The method includes receiving a design for a programmable logic device (PLD). The design includes a plurality of nodes. The method also includes modifying the design to include a logic analyzer circuit. The logic analyzer circuit includes inputs for a plurality of selectable groups of capture signals for connecting to selected nodes of the plurality of nodes. In addition, the method includes outputting the design to the PLD to program the PLD.

Certain embodiments of the present disclosure relate to a system including one or more hardware processors and a memory. The memory stores instructions. When the instructions are executed by the one or more hardware processors, the one or more hardware processors perform a method. The method includes receiving a design for a programmable logic device (PLD). The design includes a plurality of nodes. The method also includes modifying the design to include a logic analyzer circuit. The logic analyzer circuit includes inputs for a plurality of selectable groups of capture signals for connecting to selected nodes of the plurality of nodes. In addition, the method includes outputting the design to the PLD to program the PLD.

Certain embodiments of the present disclosure relate to a system including a user logic circuit programmed into a chip, which includes a plurality of nodes. The system also includes a logic analyzer circuit programmed into the chip. The logic analyzer circuit includes a capture signal group selector. The capture signal group selector is configured to select a group of capture signals from a plurality of selectable groups of capture signals corresponding to the plurality of nodes, based on a capture signal group selection input. The logic analyzer circuit also includes a trigger signal group selector. The trigger signal group selector is configured to select a group of trigger signals from a plurality of selectable groups of trigger signals corresponding to the plurality of nodes, based on a capture trigger group selection input. In addition, the system includes a memory that is configured to store one of the selected group of capture signals responsive to a condition of a corresponding one of the selected group of trigger signals being met.

Additional objects and advantages of the present disclosure will be set forth in part in the following detailed description, and in part will be obvious from the description, or may be learned by practice of the present disclosure. The objects and advantages of the present disclosure will be realized and attained by means of the elements and combinations particularly pointed out in the appended claims.

It is to be understood that the foregoing general description and the following detailed description are exemplary and explanatory only, and are not restrictive of the invention, as claimed.

BRIEF DESCRIPTION OF THE DRAWINGS

The accompanying drawings, which constitute a part of this specification, illustrate several embodiments and, together with the description, serve to explain the disclosed principles. In the drawings.

DETAILED DESCRIPTION

Figure 1:
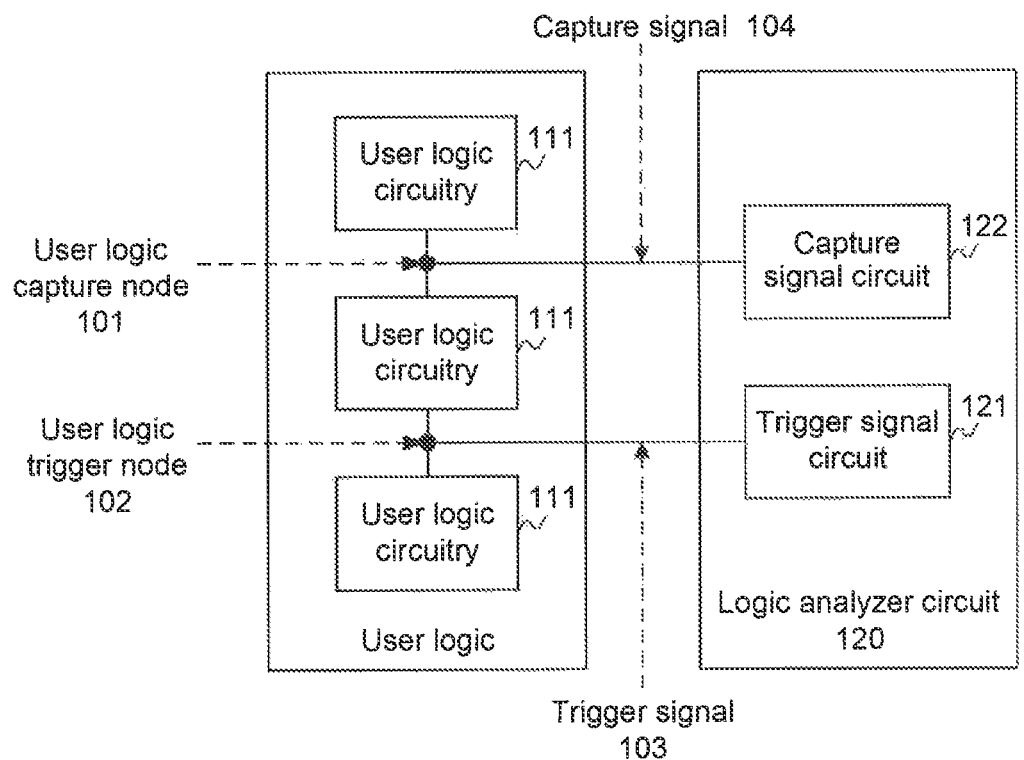
FIG. 1 illustrates an on-chip logic analyzer circuit on a PLO from the prior art.
Figure 2:
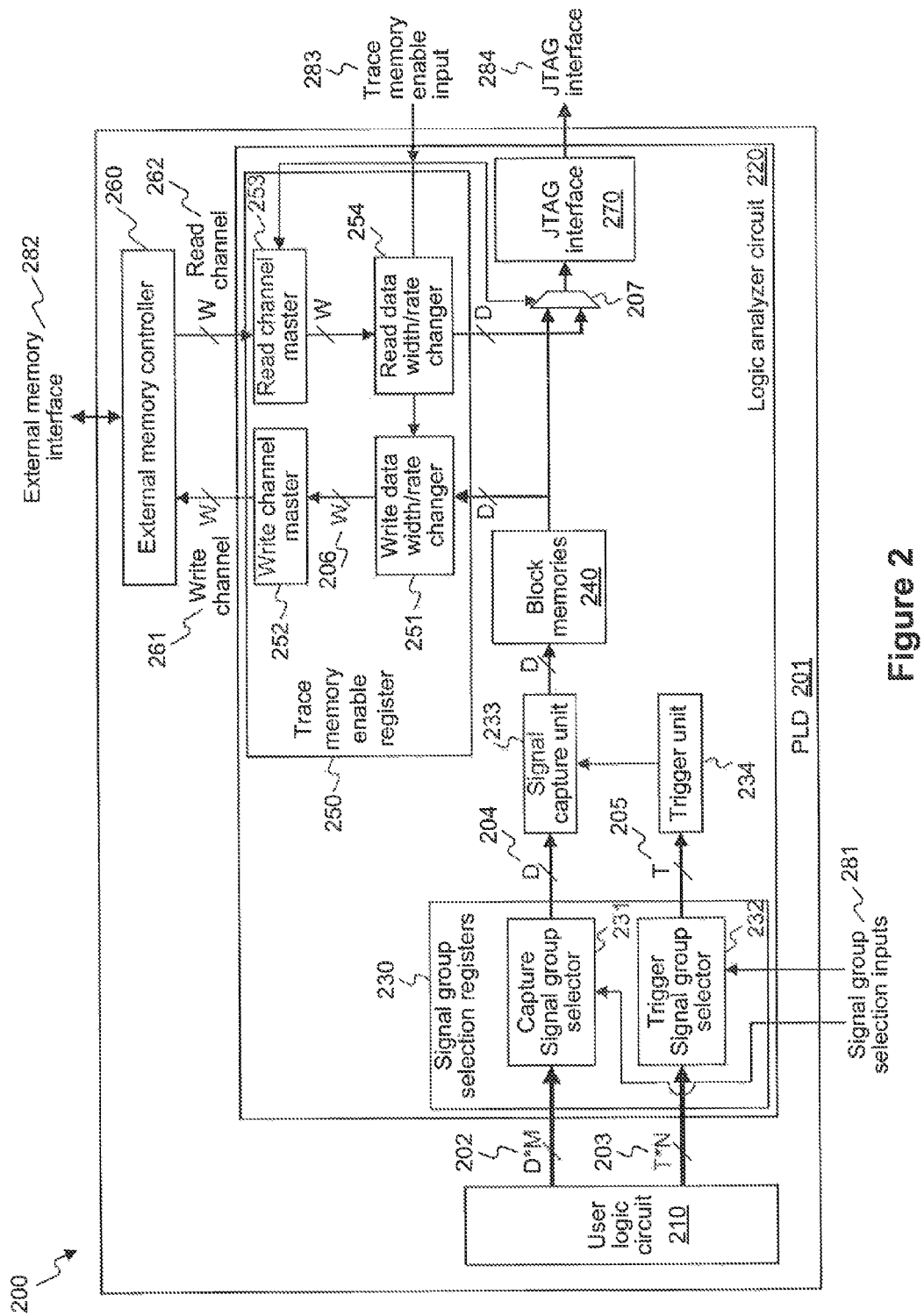
FIG. 2 illustrates an exemplary logic analyzer circuit in accordance with the present disclosure.

FIG. 2 illustrates an exemplary logic analyzer circuit 220 in accordance with the present disclosure. As shown, logic analyzer circuit 220 is implemented on PLO 201 along with user logic circuit 210 and external memory controller 260. PLD 201 may include various interfaces to receive data from and transmit data to external devices. For example, PLD 201 may be capable of receiving signal group selection inputs 281 and trace memory enable input 283. Additionally, PLD may be capable of communicating with external memory interface 282 and JTAG interface 284 of an external device such as a host computer.

Logic analyzer circuit 220 may include signal group selection registers 230 which receive groups of capture signals 202 and trigger signals 203 from user logic circuit 210 and, based on signal group selection inputs 281, pass some of the groups of capture signals 202 and trigger signals 203 to other components of logic analyzer circuit 220. The signal group selection inputs 281 may be controlled via PLD input/output or through a configurable register that is controlled through JTAG interface 284 from a host computer. In particular, registers 230 may include capture signal group selector 231, which may receive and pass capture signals 202, and trigger signal group selector 232, which may receive and pass trigger signals 203. "D" number of capture signals may be organized into "M" number of groups. "T" number of trigger signals may be organized into "N" number of groups. In certain embodiments, after identifying all of the capture and trigger signals, the number of signals that need to be concurrently sampled is determined. This may allow calculation of the maximum single group size for capture and trigger signals, defining the size of "D" and "T," respectively. The total number of capture signals may then be divided by "D" to determine the "M" number of groups needed. This step may be performed respectively for the trigger signals to determine the "N" number trigger signal groups.

Figure 3:
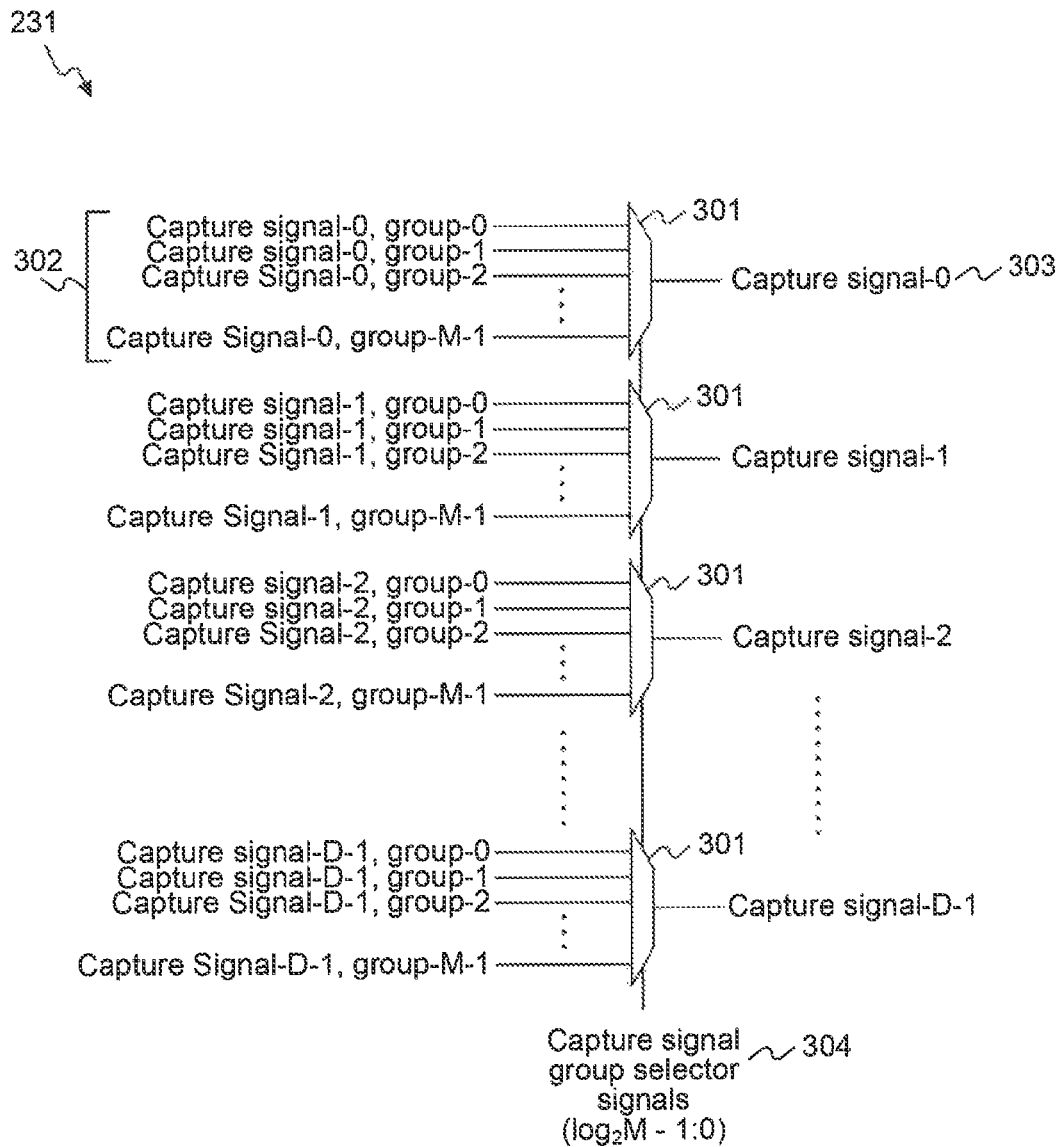
FIG. 3 illustrates an exemplary capture group selector in accordance with the present disclosure.

Referring to FIG. 3, capture signal group selector 231 may include "D" number of capture signal multiplexers 301, which may act as "M"-to-1 multiplexers. Each capture signal multiplexer may receive a respective capture signal input from each capture signal group. A first set of capture signals 302 from each group is labeled in FIG. 3, but others are present. Each set of capture signals may consist of "M" number of capture signals, corresponding to the number of capture signal groups. Capture signal multiplexers 301 may receive capture signal group selector signals 304 which indicate a group of capture signals to select. Every one of capture signal multiplexers 301 may forward a corresponding selected capture signal. Selected first capture signal 303 is explicitly identified in FIG. 3, but others are present.

In an exemplary operation, capture signal multiplexers 301 may receive capture signal group selector signals 304, which may be represented as a binary pattern corresponding to the capture signal group number. Upon receipt, capture signal multiplexers may select a corresponding capture signal from the capture signal group identified by the binary pattern. The selected capture signal may be forwarded as output. While multiplexers are illustrated in FIG. 3, other comparable digital logic may be used to produce the same result.

Figure 4:
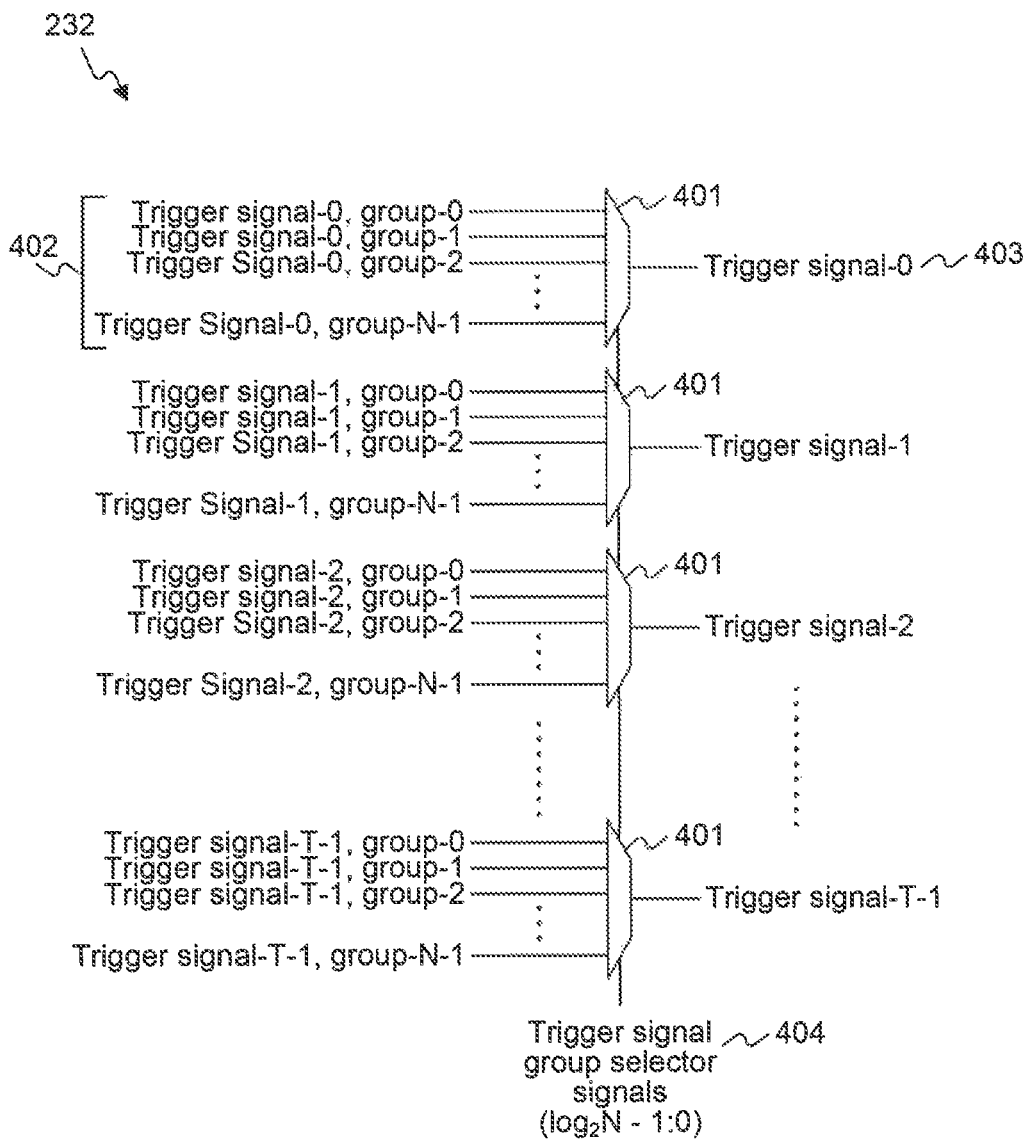
FIG. 4 illustrates an exemplary trigger group selector in accordance with the present disclosure.

Referring to FIG. 4, trigger signal group selector 232 may include "T" number of trigger signal multiplexers 401, which may act as "N"-to-1 multiplexers. Each trigger signal multiplexer may receive a respective trigger signal input from each trigger signal group. A first set of capture signals 402 from each group is labeled in FIG. 4, but others are present. Each set of capture signals may consist of "N" number of trigger signals, corresponding to the number of trigger signal groups. Trigger signal multiplexers 401 may receive trigger signal group selector signals 404 which may indicate a group of trigger signals to select. Every one of trigger signal multiplexers 401 may forward a corresponding selected trigger signal. Selected first trigger signal 403 is explicitly identified in FIG. 4, but others are present.

Similar to FIG. 3, in an exemplary operation, trigger signal multiplexers 401 may receive trigger signal group selector signals 404, which may be represented as a binary pattern corresponding to the trigger signal group number. Upon receipt, capture signal multiplexers may select a corresponding capture signal from the capture signal group identified by the binary pattern. The selected trigger signal may be forwarded as output. While multiplexers are illustrated in FIG. 4, other comparable digital logic may be used to produce the same result.

Returning to FIG. 2, capture signal group selector 231 may forward "D" selected capture signals 204 to signal capture unit 233. Similarly, trigger signal group selector 232 may forward "T" selected trigger signals 205 to trigger unit 234. Trigger unit 234 then may transmit an indication to signal capture unit 233 when a selected trigger signal condition is met. Signal capture unit 233 may receive the indication and send the corresponding capture signal to block memories 240.

Block memories 240 may interface with trace memory enable register 250 and with JTAG interface 270. Memory selector multiplexer 207 may send signals directly from block memories 240 or trace memory enable register 250 to JTAG interface 270 based on trace memory enable input 283. Trace memory enable input 283 may be controlled via PLD input/output or through a configurable register that is controlled through JTAG interface 284 from a host computer. When trace memory enable input 283 is engaged, block memories may feed stored capture signals to write data width/rate changer 251.

Write data width/rate changer 251 may enable logic analyzer circuit 220 to make use of larger external memory via external memory controller 260 of PLD 201 and external memory interface 282. The external memory may be any volatile or non-volatile storage, including, for example, SRAM, SDRAM, DDR, or flash storage. Typically, the external memory may be running on a clock that has a different frequency than logic analyzer circuit 220. The external memory typically may run at a higher frequency, but also may be clocked at a lower frequency. Additionally, the width of blocks in external memory (W) may typically be smaller than the width of the capture signal (D). For example, "W" may be 16, 32, 64, or 128 bits. Other external data memory widths are also known in the art and may be used with the embodiments of this disclosure. By comparison, capture data width may typically range from several hundreds to a couple thousands. Because the capture data width may not usually match the width of the external memory, a width change may be needed prior to writing capture data into external memory through write channel master 252. Additionally, because the external memory speeds may not match that of logic analyzer circuit 220, rate changes may need to be made from the capture signal (D) to the memory width (W). Width and rate changes may be made in write data width/rate changer 251.

Figure 5:
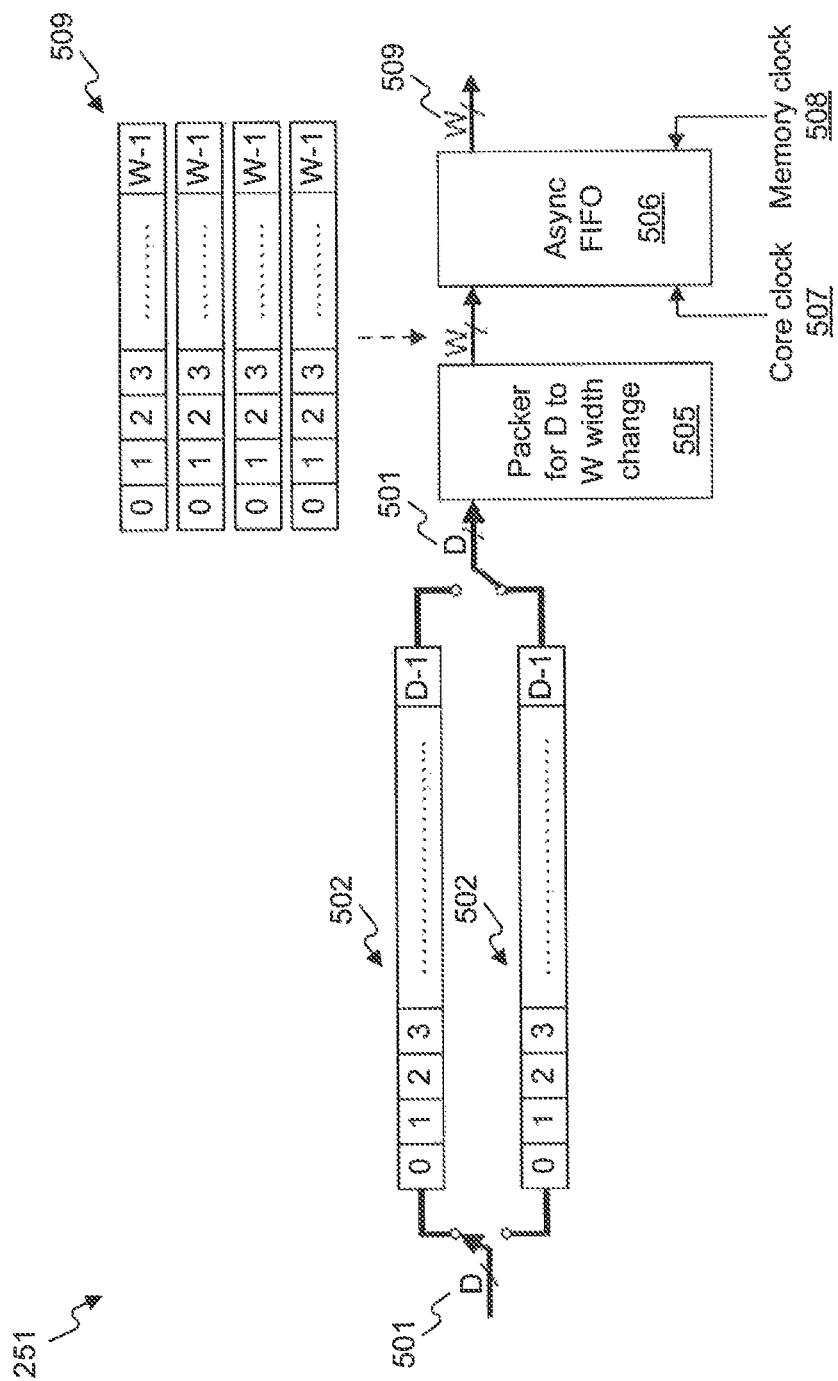
FIG. 5 illustrates an exemplary write data width/rate changer in accordance with the present disclosure.

Referring to FIG. 5, write data width/rate changer 251 may receive capture signals 501 with width "D" at ping pong buffers 502. The capture signals 501 may be written into ping pang buffers 502 alternately, as long as the one being written to is empty. The capture signals 501 stored in ping pong buffers may also have a width of "D" and may feed into packer 505. Packer 505 may pack capture signal bits with width "D" into a width "W" that may be compatible with external memory. This may be accomplished via simple split, reverse concatenation, or other known processes. Ping pang buffers 502 and packer 505 may both operate on core clock 507, which may be the clock of logic analyzer circuit 220. The output of packer 505, memory width data 509, may be written to asynchronous first-in/first-out (FIFO) buffer 506, as long as asynchronous FIFO buffer 506 is not full. Asynchronous FIFO buffer may receive the core clock 507 and memory clock 508 such that it may be written to by the logic analyzer circuit 220 at its corresponding clock speed, as well as may be read from by write channel master 252 at the clock speed of the external memory. Write channel master 252 may read from asynchronous FIFO buffer 506 whenever there may be memory width data 509 available.

Returning to FIG. 2, write channel master 252 may then forward memory width data to the external memory via write channel 261 of external memory controller 260. External memory controller 260 may typically be implemented in user logic circuit 210 or additional free space of PLD 201 to connect to the external memory via external memory interface 282. External memory controller 260 may be a multi-port memory controller, in which case one of the ports may be dedicated to write channel master 252. Alternatively, external memory controller 260 may be connected via a dedicated system bus in PLD 201 or write channel master 252 may be connected to the same bus, which may be used to transfer data to external memory controller 260. Additionally, write channel master 252 may operate using on-chip bus protocols, such as Open Core Protocol (OCP), Wishbone, Avalon, Advanced eXtensible Interface (AXI), or AMBA High-Performance Bus (AHB). Other protocols are known in the art and could be used to accomplish the same objective.

As long as trace memory enable input 283 is engaged, read channel master 253 may receive any available signal data from external memory via read channel 262 of external memory controller 260. Similar to write channel master 252, read channel master 253 may connect to a dedicated port when external memory controller 260 is a multi-port memory controller. Alternatively, external memory controller 260 may be connected via a dedicated system bus in PLD 201 or read channel master 253 may be connected to the same bus, which may be used to transfer data from external memory controller 260. Additionally, read channel master 253 may operate using on-chip bus protocols, such as Open Core Protocol (OCP), Wishbone, Avalon, Advanced eXtensible Interface (AXI), or AMBA High-Performance Bus (AHB). Other protocols are known in the art and could be used to accomplish the same objective. Read channel master 253 may send the received data to read data width/rate changer 254 when trace memory enable input 283 is engaged.

As discussed above in relation to write data width/rate changer 251, logic analyzer circuit 220 may operate at a different clock speed than the external memory. Additionally, the width of the stored data (W) may be much smaller than the width of the capture signal (D). Therefore, read data width/rate changer 254 may alter the stored data to repackage it as the original capture signal.

Figure 6:
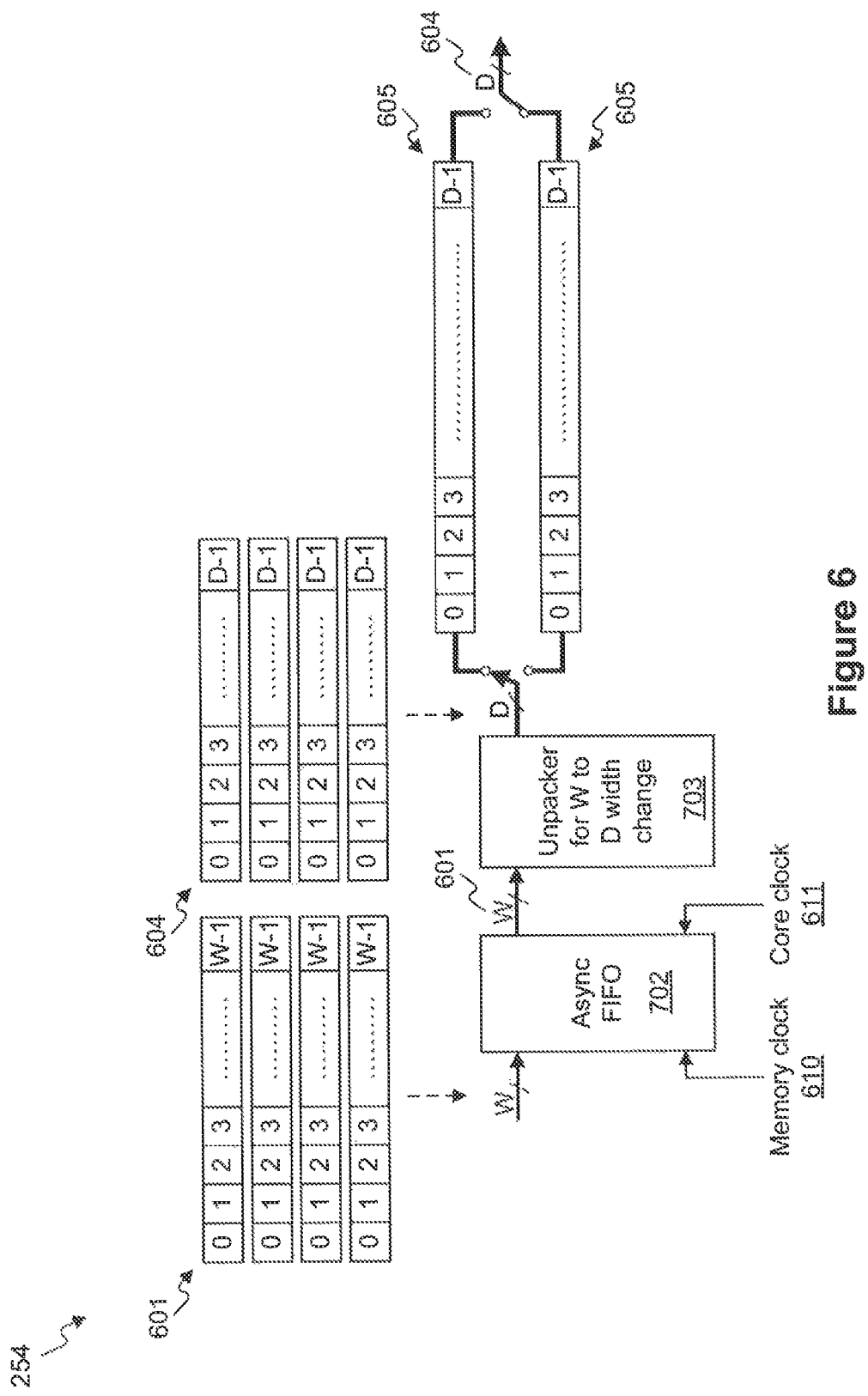
FIG. 6 illustrates an exemplary read data width/rate changer in accordance with the present disclosure.

Referring to FIG. 6, read data width/rate changer 254 may first receive stored data 601, having width "W" at asynchronous FIFO buffer 602. Asynchronous FIFO buffer 602 may be written to as long as it is not full. Asynchronous FIFO buffer may operate using both memory clock 610 and core clock 611 of logic analyzer circuit 220 to bridge the two frequency domains, if they are different. The stored data may be then sent from asynchronous FIFO buffer 602 to unpacker 603. Unpacker 603 may receive stored data 601 having width "W" and output capture signals 604, usually of a much higher width. This may be accomplished using a concatenation process or another method of recombining bit strings. Capture signal 604 may then be written into ping pong buffers 605 alternatively, if they are empty. Both ping pong buffers 605 and unpacker 603 may operate on the frequency of core clock 611. This may allow capture signal 604 to interface with the existing components of logic analyzer circuit 220, such as JTAG interface 270. The output from read data width/rate changer 254 may appear and function the same as that coming from block memories 240. Both may have the same width and operate using the same clock.

Further, as shown in FIG. 3, trace memory enable input 283 may switch memory selector multiplexer 207, such that when trace memory enable input 283 is engaged, read data width/rate changer 254 of trace memory enable register 250 is triggered to operate and transmit capture signals to JTAG interface 270 and thus JTAG interface 284 of an external device, such as a computer. If trace memory enable input 283 is not engaged, block memories 240 may transmit directly to JTAG interface 270 and trace memory enable register 250 may be bypassed.

Figure 7:
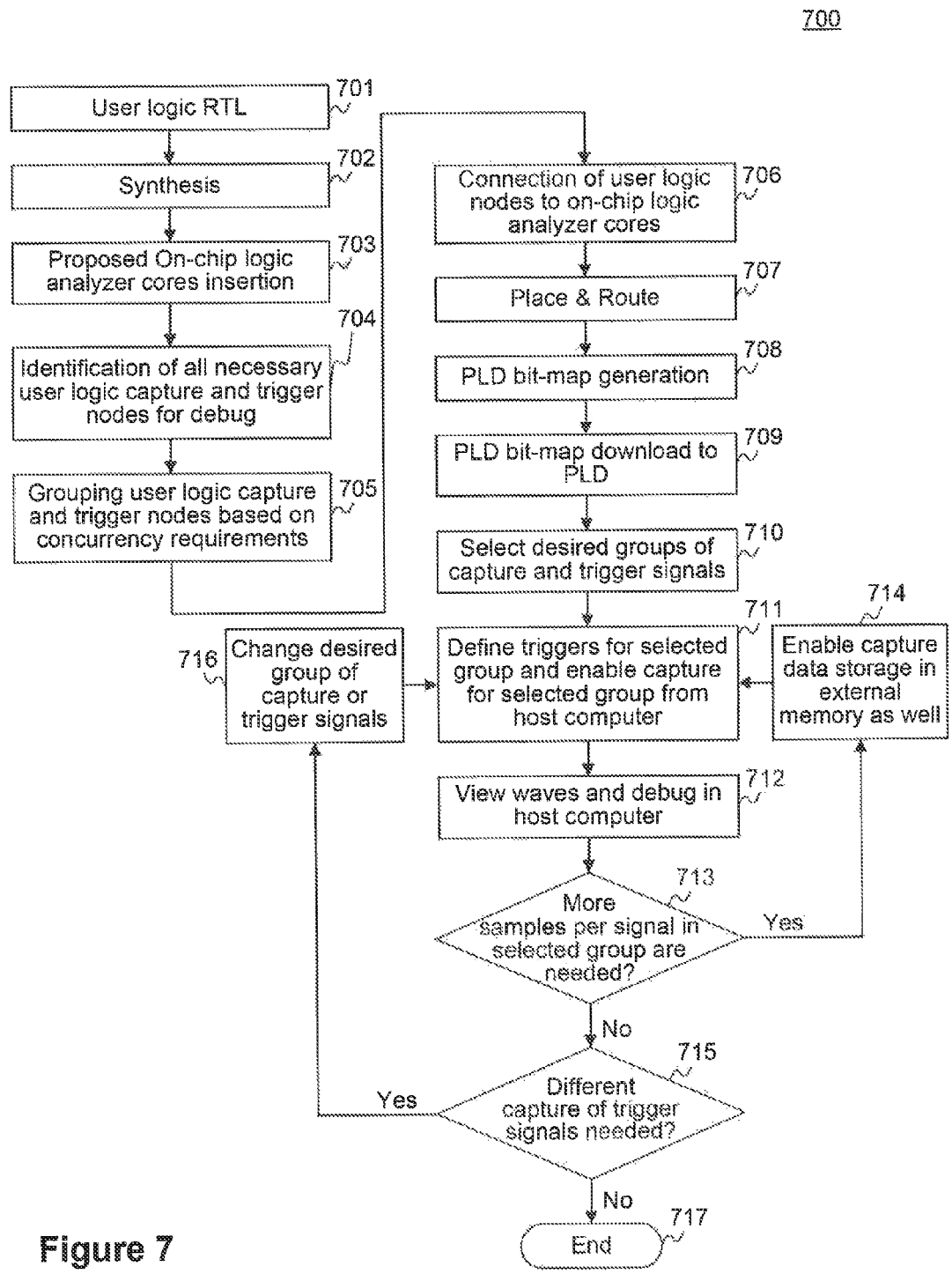
FIG. 7 is a flow chart of an exemplary PLD debug process in accordance with the present disclosure.

FIG. 7 is a flow chart of an exemplary PLO debug process in accordance with the present disclosure. At step 701 the process may begin with the synthesis of register transfer logic (RTL). RTL is a high-level abstraction representing the circuit to be implemented on the PDL, and models the flow of signals between hardware registers and the logical operations that may be executed on the signals. Next, at step 702, a netlist may be synthesized, which may describe the connectivity of the circuit design. At step 703, the user logic may be modified to include the required number of logic analyzer circuits in the netlist for the PLO based on the clock domains of the user logic circuit, such that the logic analyzer circuit may be properly synchronized with the user logic circuit. At step 703 further modifications may be made to the user logic to include all components of logic analyzer circuit 220 or external memory controller 260. The user logic circuit nodes being captured and used as triggers may be all connected to a single logic analyzer circuit if all of them belong to the same clock domain as the core clock. If any user logic circuit nodes that are being captured or being used as triggers belong to another clock domain, such as a different core clock with a different phase or frequency, a separate logic analyzer circuit may be used for those signals. At step 704, capture user logic circuit nodes may be identified. The number of capture nodes may not be limited by the number of inputs available on logic analyzer circuits. Also at step 704, user logic circuit nodes that will act as trigger nodes may be identified.

At step 705, all the user logic circuit capture and trigger nodes may be grouped based on concurrency requirements. At step 706, the identified trigger nodes and capture nodes may be connected to the inputs of the logic analyzer circuit. This may be accomplished by running a logical connection between each of the desired node and the input of the logic analyzer circuit. At step 707, the actual placement of logical components may be laid out and logical connects may be routed as physical connecting links. At step 708, a bit-map may be generated based on the placement and routing determined in step 707. At step 709, the generated bit-map may be outputted and downloaded into a PLD on a debug board. At step 710, the desired groups of capture and trigger signals may be selected via signal group selection inputs 281. At step 711, a host computer may define triggers and enable the capture of signals through the JTAG interface. At step 712, while testing, the captured signals from the PLD may be sent to the host computer via the JTAG interface 270 for viewing and debugging.

At step 713, it may be determined that additional samples are needed per signal in order to sufficiently debug the user logic circuit. Because a trace memory enable register may be implemented prior to placement and routing in step 707, at step 714 external memory may be enabled to capture additional data. Further, at step 715, it may be determined that different capture or trigger signals are needed to be used for debugging. Because multiple trigger groups and signal groups may be defined prior placement and routing, at step 716 a different group of capture signals or trigger signals may be selected for debugging. Once debugging is complete, the process 700 may end at step 717. This process eliminates the need to iteratively repeat the time consuming placement and routing (step 707), bit-map generation (step 708), and downloading of the bit-map to the PLD (step 709).

The process of FIG. 7 may be implemented on computer systems comprising one or more hardware processors using computer-readable media storing instructions, wherein the instructions configure the one or more hardware processors to perform the process.

Figure 8:
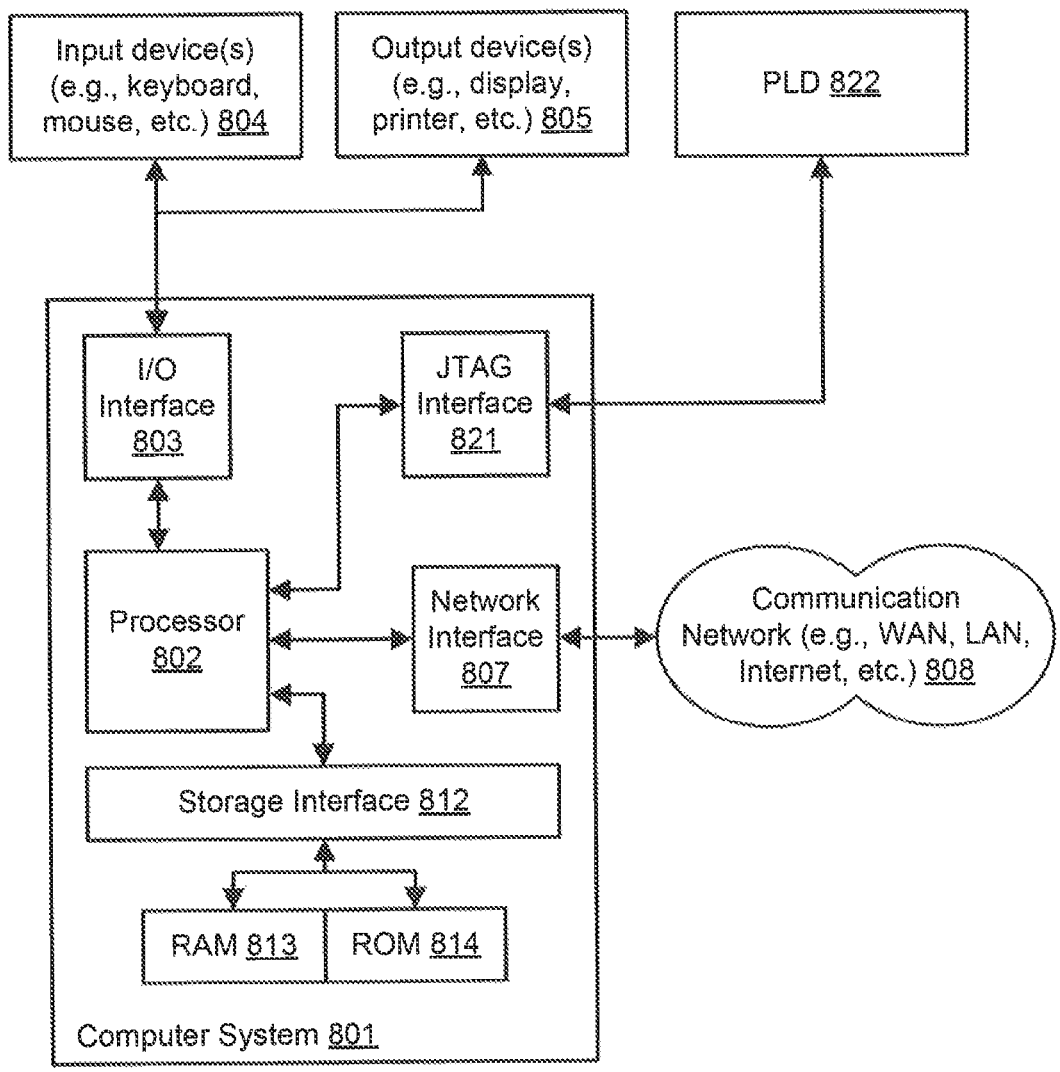
FIG. 8 is a block diagram of an exemplary computer system for implementing embodiments consistent with the present disclosure.

FIG. 8 is a block diagram of an exemplary computer system 801 for implementing the process of FIG. 8. Computer system 801 may comprise a central processing unit ("CPU" or "hardware processor") 802. Processor 802 may comprise at least one data processor for executing program components for handling user- or system-generated requests. A user may include a person, a person using a device such as such as those included in this disclosure, or such a device itself. The processor may include a microprocessor, such as AMD Athlon, Duron or Opteron, ARM's application, embedded or secure processors, IBM PowerPC, Intel's Core, Itanium, Xeon, Celeron or other line of processors, etc. The processor 802 may be implemented using mainframe, distributed processor, multi-core, parallel, grid, or other architectures.

Processor 802 may be disposed in communication with one or more input/output (I/O) devices via I/O interface 803. The I/O interface 803 may employ communication protocols/methods such as, without limitation, serial bus, universal serial bus (USB), infrared, PS/2, BNC, coaxial, component, composite, digital visual interface (DVI), high-definition multimedia interface (HDMI), RF antennas, S-Video, VGA, IEEE 802.n/b/g/n/x, Bluetooth, etc. Using the I/O interface 803, the computer system 801 may communicate with one or more I/O devices. Output device 805 may be a printer, video display, audio speaker, etc. For example, in step 712, signal waves may be viewed on a monitor using a DVI connection. I/O interface 803 may also be used to execute other steps of process 700. Input device 804 may be, for example, a keyboard or mouse. For example, computer system 801 may receive input from input device 804 for performing steps of process 700, such as input to identify user logic capture and trigger nodes in step 704.

Computer system 801 may also communicate with PLD 822 for programming, reading data from, and writing data to PLO 822. JTAG interface 821 may comprise a JTAG interface or another interface for suitably communicating with PLD 822. PLD 822 may be any programmable logic device suitable for implementing the circuitry described in FIG. 2. For example, PLD 822 may be a Field-Programmable Gate Array (FPGA), Complex Programmable Logic Device (CPLD), or Application Specific Integrated Circuit (ASIC). Additional types of PLDs are known in the art and would be suitable for implementing the circuitry depicted in FIG. 2.

In some embodiments, the processor 802 may be disposed in communication with a communication network 808 via a network interface 807. Network interface 807 may employ connection protocols. This may permit, for example, computer system 801 to receive a design for a user logic circuit over a local area network (LAN) or the internet.

In some embodiments, the processor 802 may be disposed in communication with one or more memory devices (e.g., RAM 813, ROM 814, etc.) via a storage interface 812. The storage interface may connect to memory devices including, without limitation, memory drives, removable disc drives, etc. The memory devices may store a collection of program or database components operative to load and store designs for a user logic circuit. Further, the memory may be operative to store waveforms received from logic analyzer circuitry.

The illustrated steps are set out to explain the exemplary embodiments shown, and it should be anticipated that ongoing technological development will change the manner in which particular functions are performed. These examples are presented herein for purposes of illustration, and not limitation. Further, the boundaries of the functional building blocks have been arbitrarily defined herein for the convenience of the description. Alternative boundaries can be defined so long as the specified functions and relationships thereof are appropriately performed. Alternatives (including equivalents, extensions, variations, deviations, etc., of those described herein) will be apparent to persons skilled in the relevant art(s) based on the teachings contained herein. Such alternatives fall within the scope and spirit of the disclosed embodiments. Also, the words "comprising," "having," "containing," and "including," and other similar forms are intended to be equivalent in meaning and be open ended in that an item or items following any one of these words is not meant to be an exhaustive listing of such item or items, or meant to be limited to only the listed item or items. It must also be noted that as used herein and in the appended claims, the singular forms, and "the" include plural references unless the context clearly dictates otherwise.

Furthermore, one or ore computer-readable storage media may be utilized in implementing embodiments consistent with the present disclosure. A computer-readable storage medium refers to any type of physical memory on which information or data readable by a processor may be stored. Thus, a computer-readable storage medium may store instructions for execution by one or more processors, including instructions for causing the processor(s) to perform steps or stages consistent with the embodiments described herein. The term "computer-readable medium" should be understood to include tangible items and exclude carrier waves and transient signals, i.e., be non-transitory. Examples include random access memory (RAM), read-only memory (ROM), volatile memory, nonvolatile memory, hard drives, CD ROMs, DVDs, flash drives, disks, and any other known physical storage media.

It is intended that the disclosure and examples be considered as exemplary only, with a true scope and spirit of disclosed embodiments being indicated by the following claims.

What is claimed is:

1. A computer-implemented method comprising:
   receiving a design for a programmable logic device (PLD), the design including a plurality of nodes;
   modifying, via one or more hardware processors, the design to include
      a logic analyzer circuit, the logic analyzer circuit including inputs for a plurality of selectable groups of capture signals for connecting to selected nodes of the plurality of nodes;
      an external memory interface for connecting the logic analyzer circuit to an external memory; and
      a trace memory enable register configured to alter a rate and format of data written to and read from the external memory; and
   outputting the design to configure the PLD.

2. The method of claim 1, wherein:
   the logic analyzer circuit is arranged to store signals from the selected nodes when the logic analyzer circuit is programmed into the PLD.

3. The method of claim 1, wherein the external memory interface and the trace memory enable register may be disabled.

4. The method of claim 1, comprising: modifying, via the one or more hardware processors, the design to include:
   a plurality of selectable groups of trigger signals, wherein any one of the trigger signals can be connected to any one of the nodes;
   and for each trigger signal, a trigger condition for the logic analyzer circuit.

5. The method of claim 4, wherein a trigger signal corresponds to a capture signal, such that when the trigger condition of the trigger signal is satisfied, the capture signal is stored in memory.

6. The method of claim 4, wherein a trigger signal corresponds to multiple capture signals.

7. A non-transitory, computer-readable medium storing instructions that, when executed by a processor, cause the processor to perform a method, the method comprising:
   receiving a design for a programmable logic device (PLD), the design including a plurality of nodes;
   modifying the design to include
      a logic analyzer circuit, the logic analyzer circuit including inputs for a plurality of selectable groups of capture signals for connecting to selected nodes of the plurality of nodes;
      an external memory interface which connects the logic analyzer circuit to an external memory; and
      a trace memory enable register configured to alter the rate and format of the data written to and read from the external memory; and
   outputting the design to configure the PLD.

8. The computer-readable medium of claim 7, wherein:
   the logic analyzer circuit is arranged to store signals from the selected nodes when the logic analyzer circuit is programmed into the PLD.

9. The computer-readable medium of claim 7, wherein the external memory interface and the trace memory enable register may be disabled.

10. The computer-readable medium of claim 7, wherein the method comprises: modifying the design to include:
    a plurality of selectable groups of trigger signals, wherein any of the trigger signals can be connected to any one of the nodes; and
    for each trigger signal, a trigger condition for the logic analyzer circuit.

11. The computer-readable medium of claim 10, wherein a trigger signal corresponds to a capture signal, such that when the trigger condition of the trigger signal is satisfied, the capture signal is stored in memory.

12. The computer-readable medium of claim 10, wherein a trigger signal corresponds to multiple capture signals.

13. A system comprising: one or more hardware processors; and a memory storing instructions that, when executed by the one or more hardware processors, cause the one or more hardware processors to perform a method, the method comprising:
    receiving a design for a programmable logic device (PLD), the design including a plurality of nodes;
    modifying the design to include
       a logic analyzer circuit, the logic analyzer circuit including inputs for a plurality of selectable groups of capture signals for connecting to selected nodes of the plurality of nodes;
       an external memory interface which connects the logic analyzer circuit to an external memory; and
       a trace memory enable register configured to alter the rate and format of the data written to and read from the external memory; and
    outputting the design to configure the PLD.

14. The system of claim 13, wherein:
    the logic analyzer circuit is arranged to store signals from the selected nodes when the logic analyzer circuit is programmed into the PLD.

15. The computer-readable medium of claim 13, wherein the external memory interface and the trace memory enable register may be disabled.

16. The system of claim 13, wherein the method comprises: modifying the design to include:

a plurality of selectable groups of trigger signals, wherein any of the trigger signals can be connected to any one of the nodes; and for each trigger signal, a trigger condition for the logic analyzer circuit.

17. The system of claim 16, wherein a trigger signal corresponds to a capture signal, such that when the trigger condition of the trigger signal is satisfied, the capture signal is stored in memory.

18. The system of claim 16, wherein a trigger signal corresponds to multiple capture signals.

19. A logic analyzer circuit programmed into a chip, comprising:

a capture signal group selector configured to select a group of capture signals from a plurality of selectable groups of capture signals corresponding to a plurality of nodes, based on a capture signal group selection input; and a trigger signal group selector configured to select a group of trigger signals from a plurality of selectable groups of trigger signals corresponding to the plurality of nodes, based on a capture trigger group selection input; and a trace memory enable register configured to alter the rate and format of the data written to and read from a memory that is external to the chip and configured to store one of the selected group of capture signals responsive to a condition of a corresponding one of the selected group of trigger signals being met.

20. The logic analyzer circuit of claim 19, wherein the trace memory enable register may be disabled.

* * * * *